United States Patent
Bartlett et al.

(10) Patent No.: US 8,024,141 B2
(45) Date of Patent: Sep. 20, 2011

(54) TEST AND MEASUREMENT INSTRUMENT AND METHOD FOR PROVIDING POST-ACQUISITION TRIGGER CONTROL AND PRESENTATION

(75) Inventors: Josiah A. Bartlett, Forest Grove, OR (US); Kristie L. Veith, Portland, OR (US); Steven K. Sullivan, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 190 days.

(21) Appl. No.: 12/576,045

(22) Filed: Oct. 8, 2009

(65) Prior Publication Data

US 2011/0060541 A1 Mar. 10, 2011

Related U.S. Application Data

(60) Provisional application No. 61/240,054, filed on Sep. 4, 2009.

(51) Int. Cl.
*G01R 13/02* (2006.01)
(52) U.S. Cl. .......................................................... 702/67
(58) Field of Classification Search ...................... 702/67
See application file for complete search history.

(56) References Cited

U.S. PATENT DOCUMENTS 6,807,496 B2 10/2004 Pickerd
2009/0215402 A1* 8/2009 Ng ................................. 455/69

* cited by examiner

*Primary Examiner* — Tung S Lau
(74) *Attorney, Agent, or Firm* — David S. Crowther; Thomas F. Lenihan

(57) ABSTRACT

A test and measurement instrument and method for providing post-acquisition trigger control and presentation of associated waveforms on a display. An electrical signal under test is sampled and digitized, and stored in an acquisition memory as a data record. A display device draws a waveform associated with the signal under test. After the acquisition of the digital samples is stopped, a user selects trigger criteria using trigger controls such as a trigger level control. A trigger circuit detects a post-acquisition trigger event in the data record based on the trigger criteria causing an automatic adjustment of the waveform to conform to a time of the post-acquisition trigger event. One or more configurable trigger controls can be used to adjust a display of post-acquisition trigger events and waveforms. Upon resumption of the live-acquisition of data, the live waveform conforms to the newly selected trigger criteria as previewed during the post-acquisition mode.

17 Claims, 14 Drawing Sheets

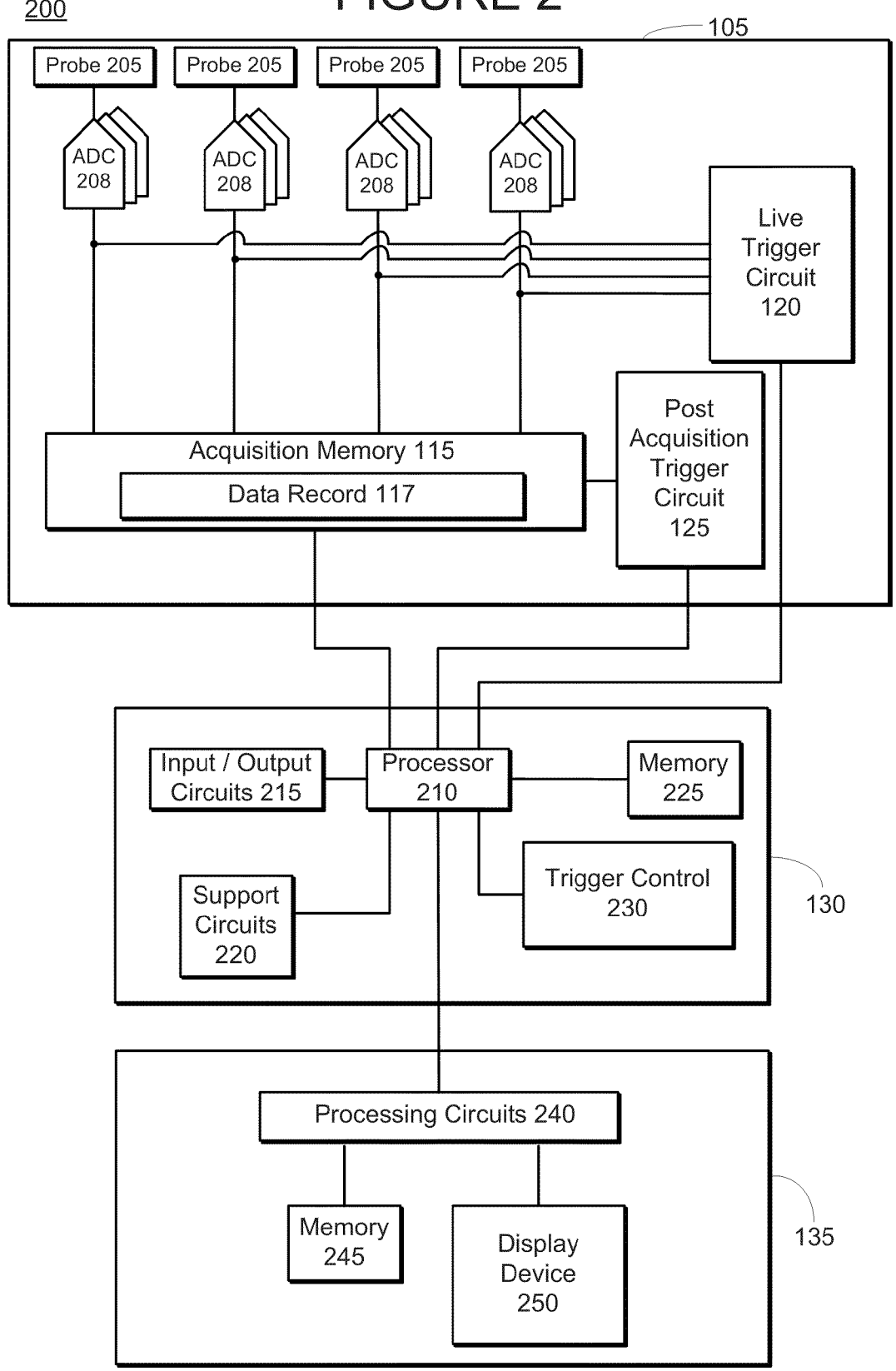

Live-Acquisition Mode

Post-Acquisition Mode

TEST AND MEASUREMENT INSTRUMENT AND METHOD FOR PROVIDING POST-ACQUISITION TRIGGER CONTROL AND PRESENTATION

RELATED APPLICATION DATA

This application claims the benefit of U.S. Provisional Application Ser. No. 61/240,054, filed Sep. 4, 2009, incorporated herein by reference. This application is related to TEST AND MEASUREMENT INSTRUMENT AND METHOD FOR PROVIDING POST-ACQUISITION TRIGGER CONTROL AND PRESENTATION (Bartlett, et al.), filed on even date herewith, which also claims the benefit of U.S. Provisional Application Ser. No. 61/240,054, filed Sep. 4, 2009.

BACKGROUND

This disclosure relates to test and measurement instruments, in particular to test and measurement instruments and methods relating to post-acquisition trigger control and presentation of associated waveforms on a display.

Modern digital oscilloscopes can acquire an electrical signal under test and store digital data corresponding to the acquired signal as a data record. Such oscilloscopes can be used to display one or more waveforms while acquiring the electrical signal under test. In addition, the previously-stored digital data from the data record can be viewed as a waveform on a display of the oscilloscope even though acquisition of the electrical signal under test has stopped. While older oscilloscopes would generally acquire a relatively small data record corresponding to an amount of time that could be displayed, advancements in the areas of memory speed, memory capacity, and processor speed have led to newer oscilloscopes having improved functionality in this area. Consider that most digital oscilloscopes now have the capability of storing a significantly larger data record, which corresponds to more time than can reasonably be displayed at once.

As a result of the larger data records, additional functionality can be made available to the user. For example, most oscilloscopes allow a user to adjust a horizontal or vertical control, thereby changing a position of the waveform on the display. In addition, some oscilloscopes allow a user to "scroll" through the waveform—particularly after the data record has been acquired. However, since the data record now represents much more time than can be displayed at one time, the user's time interval of interest may be short compared to the full acquired record, and scrolling through an entire data record can be impractical. This causes difficulty in finding and analyzing the time interval of interest. Moreover, the full record may contain other events of interest that are different from the one event being displayed.

Some oscilloscopes provide a search feature to flag events of interest in the data record. But due to the rapid advancements in memory capacities, the size of data records continues to expand, which can hinder or otherwise slow down conventional search techniques. In addition, none of the conventional approaches provide for post-acquisition trigger events that are controlled and displayed intuitively by emulating a live trigger mode using standard trigger controls.

SUMMARY

An embodiment of the invention can be implemented in a test and measurement instrument, comprising, for example, an input terminal to receive a signal under test, one or more analog-to-digital converters associated with the input terminal, the one or more analog-to-digital converters to receive the signal under test and to produce digital samples from the signal under test, and an acquisition memory to store the digital samples of the signal under test as a data record. A display device draws a waveform associated with the signal under test. A first trigger circuit having an input coupled to the input terminal detects a live trigger event in the signal under test based on first trigger criteria and causes an automatic adjustment of the waveform to conform with a time of the live trigger event. A user may halt the acquisition of the signal under test using an input control. A second trigger circuit detects a post-acquisition trigger event in the data record based on second trigger criteria and causes an automatic adjustment of the waveform to conform with a time of the post-acquisition trigger event.

Some embodiments include a method for displaying a waveform associated with a post-acquisition trigger on a test and measurement instrument, the method comprising, for example, acquiring data from a signal under test for storage in an acquisition memory as a data record and displaying a waveform associated with the signal under test while acquiring the data. After halting acquisition of the data record, standard trigger controls may be adjusted to select trigger criteria. A post-acquisition trigger event is detected in the data record based on the trigger criteria, and a position of the waveform is automatically shifted to conform with a time of the post-acquisition trigger event.

Another embodiment includes a test and measurement instrument, comprising, for example, an input terminal to receive a signal under test, one or more analog-to-digital converters associated with the input terminal, the one or more analog-to-digital converters to receive the signal under test and to produce digital samples from the signal under test, and an acquisition memory to store the digital samples of the signal under test as a data record. A display device draws a waveform associated with the signal under test. An analog trigger circuit includes an input coupled to the input terminal to detect a live trigger event in the signal under test based on first trigger criteria and causes an automatic adjustment to the waveform to conform with a time of the live trigger event. The test and measurement instrument may also include one or more digital-to-analog converters to receive the digital samples from the acquisition memory and to produce a converted analog signal. The analog trigger circuit may be configured to receive the converted analog signal to detect a post-acquisition trigger event in the data record based on second trigger criteria and to cause an automatic adjustment to the waveform to conform with a time of the post-acquisition trigger event.

In yet another example embodiment, a test and measurement instrument comprises an input terminal to receive a signal under test, an acquisition memory to store digital samples of the signal under test as a data record, a display device to draw a plurality of waveforms associated with the signal under test, a detector to detect a first trigger event in the signal under test based on first trigger criteria and to cause an adjustment of at least one of the plurality of waveforms during a live trigger mode to conform with a time of the first trigger event, and a second detector to detect second trigger events in the data record based on second trigger criteria. The test and measurement instrument may include first trigger controls to configure the first trigger criteria or the second trigger criteria, and second trigger controls to configure which of the second trigger events or waveforms are displayed on the display device. The first trigger controls may comprise standard trigger controls and the second trigger controls may comprise post-acquisition mode specific trigger controls.

BRIEF DESCRIPTION OF THE DRAWINGS

FIG. 2 is a block diagram illustrating additional example elements of the acquisition unit, the controller, and the display unit of FIG. 1.

DETAILED DESCRIPTION

Embodiments include, for example, test and measurement instruments and techniques for providing post-acquisition trigger control and presentation of associated waveforms on a display. In particular, in one embodiment, the test and measurement instrument includes a trigger circuit to automatically adjust a waveform to conform with a time of a post-acquisition trigger event. The test and measurement instrument may include a trigger control to configure live trigger criteria for detecting a live trigger event and post-acquisition trigger criteria for detecting the post-acquisition trigger event after the acquisition of waveform data has halted. A user can adjust the post-acquisition trigger criteria and preview how the next live waveform acquisition will appear. When the acquisition of the live waveform(s) resume, the live trigger criteria substantially matches the previous post-acquisition trigger criteria.

For example, the trigger control includes a trigger level control to select trigger points associated with the live trigger event and the post-acquisition trigger event. An adjustment to the trigger level control after the acquisition of waveform data has halted can cause a waveform associated with previously acquired data to be automatically adjusted, thereby conforming to a time of the post-acquisition trigger event. Upon resumption of the live-acquisition of data, the live waveform(s) may conform to the newly selected trigger criteria as previewed during the post-acquisition mode.

In addition, during the post-acquisition mode, the user may quickly find an unusual waveform by simultaneously viewing multiple trigger events or waveforms associated with a given data record, and then using a range control to progressively increase or decrease the number of trigger events displayed, and/or the number of waveforms displayed. These and other inventive aspects will now be discussed in further detail.

Figure 1:
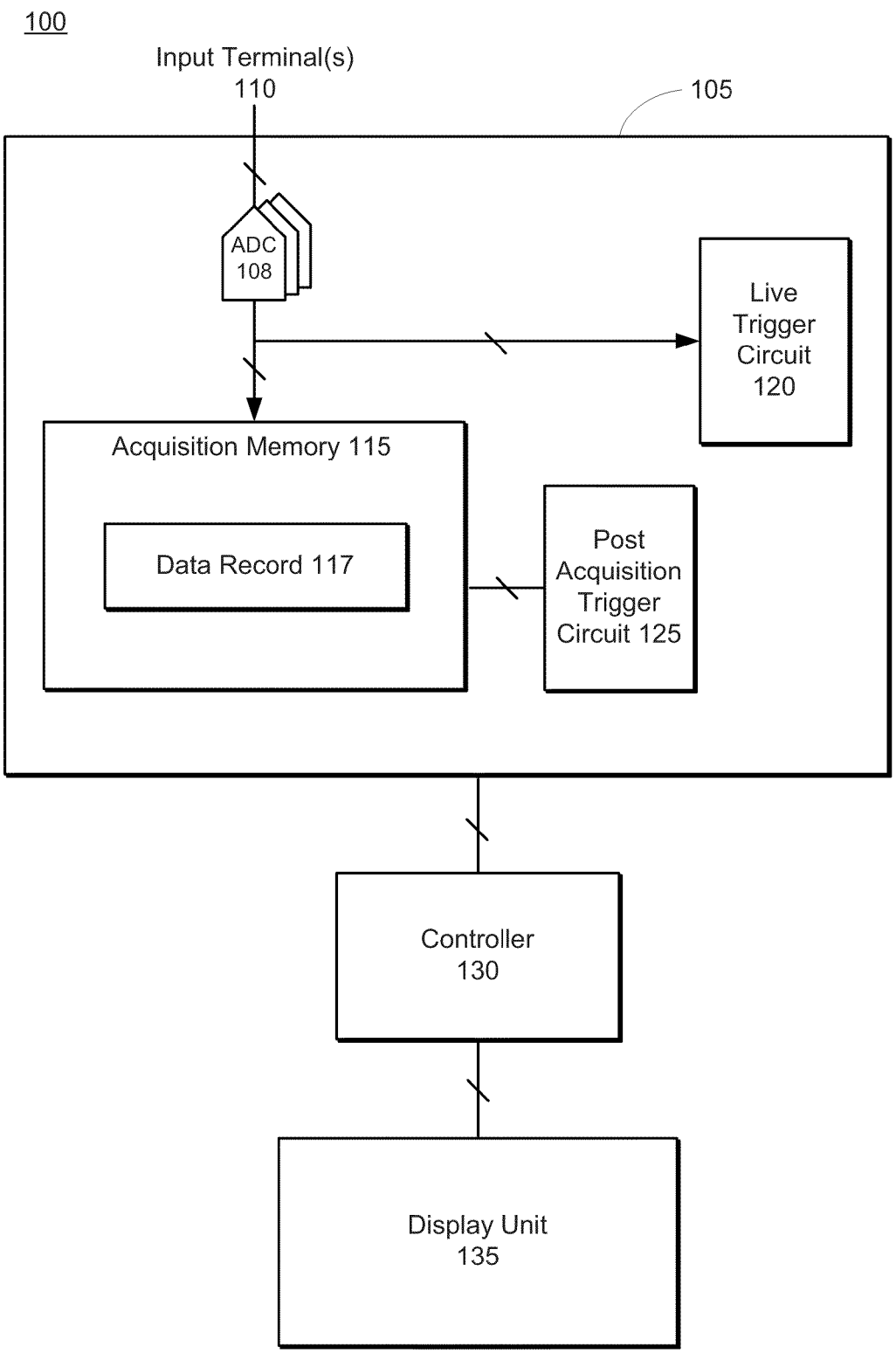
FIG. 1 is a block diagram of a test and measurement instrument including an acquisition and trigger unit, a controller, and a display unit according to an example embodiment.

FIG. 1 is a block diagram of a test and measurement instrument 100 including an acquisition and trigger unit 105, a controller 130, and a display unit 135 according to an example embodiment. The test and measurement instrument 100 may be a digital oscilloscope, for example, and for the sake of brevity but not limitation, will generally be referred to as such. The oscilloscope 100 may have multiple channels or inputs suitable for use with various embodiments as described herein. Although the oscilloscope may have a single input terminal 110, inventive aspects described are equally applicable to an oscilloscope having four inputs, or any number of inputs.

The acquisition and trigger unit 105 of the oscilloscope 100 may include a digital acquisition memory 115. Although the acquisition memory 115 is shown as a single block, which can represent a single memory, it should be understood that the acquisition memory 115 can include multiple discrete memories. In that scenario, each discrete memory can operate individually with respect to the various inputs 110, or alternatively, the discrete memories can operate collectively to one or more of the inputs 110. For example, as certain input terminals 110 are deselected, an increased memory depth can be applied to the remaining selected inputs 110. It should be understood that the inventive aspects contemplate a data record 117 holding any one of filtered, compressed, unfiltered, or uncompressed raw data. In addition, while one data record 117 is shown, it should be understood that one or more data records 117 may be stored in the acquisition memory 115.

The acquisition and trigger unit 105 can include one or more analog-to-digital converters (ADC) 108 and a live trigger circuit 120. The live trigger circuit 120 includes an input coupled to one or more of the input terminals 110, for example, after the ADCs 108. It should be understood that an alternative embodiment includes the live trigger circuit 120 coupled to one or more of the input terminals 110 before the ADCs 108. An electrical signal under test is received at one or more of the input terminals 110. The live trigger circuit 120 can detect a live trigger event in the signal under test based on first trigger criteria selected by the user, and can cause an automatic adjustment of the waveform to conform with a time of the live trigger event.

The acquisition and trigger unit 105 can also include a post-acquisition trigger circuit 125. The trigger circuits 120 and 125 may be implemented by hardware, software, or by any combination thereof. After the acquisition of data has stopped, the post-acquisition trigger circuit 125 can detect a post-acquisition trigger event in the data record 117 based on second trigger criteria selected by the user. The post-acquisition trigger circuit 125 can cause an adjustment of the waveform to conform to a time of the post-acquisition trigger event. These and other aspects of the acquisition memory and trigger circuits will be described in further detail below.

The live trigger circuit 120 and the post-acquisition circuit 125, while shown as two separate circuits, may be implemented with one set of hardware serving both the live trigger circuit function and the post-acquisition circuit function, for example, at different times. Alternatively, the live trigger circuit 120 and the post-acquisition circuit 125 are separate from each other, each of which may include similar circuits as the other.

The acquisition and trigger unit 105 may be operatively coupled to the controller 130. The controller 130 may be operatively coupled to the display unit 135, and may process the sampled data streams provided by the acquisition and trigger unit 105 for display by the display unit 135. For example, given desired time per division and volts per division display parameters of the oscilloscope 100, the controller 130 may modify and then render the raw data associated with an acquired sample data stream to produce a corresponding waveform image having the desired time per division and volts per division parameters.

FIG. 2 is a block diagram illustrating additional example elements of the acquisition and trigger unit 105, the controller 130, and the display unit 135 of FIG. 1. Probes 205 are operatively associated with the other elements of the acquisition and trigger unit 105. The probes 205 may be any conventional voltage or current probes suitable for respectively detecting one or more electrical signals, such as analog voltage or current signals from a circuit under test (not shown). For example, the probes 205 may be provided by Tektronix®, Inc., such as active probe model numbers P1075, TCP105, among others, which may be used to acquire real time electrical signal information. The output signals of probes 205 are sent to the analog-to-digital converters (ADCs) 208, which sample and digitize the electrical signals. Thereafter, the digital samples are eventually stored as the data record 117 in the acquisition memory 115.

The acquisition and trigger unit 105 is operatively coupled to the controller 130. The controller 130 may include, for example, a processor 210, support circuits 220, input/output (I/O) circuits 215, memory 225, and a trigger control 230. As such, it is contemplated that some of the processes discussed herein may be implemented as software processes in processor 210, and some of the processes discussed herein may be implemented within hardware, for example, as circuitry that cooperates with processor 210 to perform various functions. In addition, some of the processes discussed herein may be implemented using a combination of software, hardware, firmware, or other execution or storage means. The information stored in the acquisition memory 115 may be transmitted to the processor 210 or the post-acquisition trigger circuit 125. In addition, the processor 122 may transmit control information to the acquisition memory 115 or the post-acquisition trigger circuit 125.

The I/O circuits 215 may form an interface between the various elements communicating with the controller 130. For example, the I/O circuits 215 may comprise an interconnection to a keypad, pointing device, touch screen, external PC, or other peripheral devices adapted to provide user input and output to the controller 130. The controller 130, in response to such user input, may control the operations of the acquisition and trigger unit 105, and to perform various functions, in particular filtering or other compression operations, but also including such operations as data acquisitions or processing, among other possibilities.

The memory device 225 is operatively associated with the processor 210. The acquisition memory 115 and the memory device 225 may include volatile memory, such as SRAM, DRAM, among other volatile memories. These memories may also include non-volatile memory devices, such as a disk drive or a tape medium, among others, or programmable memory, such as an EPROM, EEPROM, or flash memory, among other possibilities.

Although the controller 130 of FIG. 2 is depicted as a general purpose computer or microprocessor that is programmed to perform various control functions in accordance with embodiments of the present invention, the embodiments may be implemented in hardware such as, for example, an application specific integrated circuit (ASIC). As such, it is intended that the controller 130, as described herein, be broadly interpreted as being equivalently performed by hardware, software, or by any combination thereof.

It will be appreciated by those skilled in the art that standard signal processing components (not shown), such as signal buffering circuitry, signal conditioning circuitry, display drivers, and the like are also employed as required to enable the various interface functions described herein. For example, the ADCs 208 sample the electrical signals under test at a sufficiently high rate to enable appropriate processing by the controller 130 or the processing circuits 240 of the display unit 135. In this regard, the ADCs 208 may sample their respective input electrical signals in accordance with a sample clock provided by an internal sample clock generator (not shown), which may be a part of, for example, the support circuits 220.

Controller 130 provides the waveform data to the display unit 135. The display unit 135 includes processing circuits 240 for subsequent presentation of the waveform data on a display device 250. The processing circuits 240 may include data processing circuitry suitable for converting acquired data streams or waveform data into video images or video signals, which are adapted to provide visual imagery (e.g., video frame memory, display formatting and driver circuitry, and the like). The processing circuits 240 interface with a memory 245, also included in the display unit 135, which may be arranged in memory planes, and may be configured to store the video images, among other possibilities. The processing circuits 240 and/or the memory 245 provide output signals suitable for use by a display device 250. User input received through I/O circuits 215 or trigger control 230, for example, may be used to adjust automatic calibration functions, or to adapt other operating parameters of the processing circuits 240 or of display device 250. The display device 250 may be configured to display the video images and to shift or otherwise adjust a waveform responsive to trigger events when in a post-acquisition mode, as will further be described in detail below.

The live trigger circuit 120 includes an input coupled to one or more of the lines associated with probes 205, for example, after the ADCs 208. It should be understood that an alternative embodiment includes the live trigger circuit 120 coupled to one or more of the lines associated with probes 205 before the ADCs 208. The live trigger circuit detects a live trigger event in the signal under test based on predefined trigger criteria selected by the user using the trigger control 230. As a result, the live trigger circuit 120 can cause an automatic adjustment of the waveform on the display device 250 to conform to a time of the live trigger event.

Conversely, the post-acquisition trigger circuit 125 can be operatively coupled to the acquisition memory 115 and receive the digital samples of the data record 117 after the electrical signal under test has been converted and digitized using the ADCs 208, and after the acquisition period has stopped. The post-acquisition trigger circuit 125 can detect a post-acquisition trigger event in the data record based on predefined trigger criteria selected by the user using the trigger control 230. As a result, the post-acquisition trigger circuit 125 can cause an automatic adjustment of the waveform on the display device 250 to conform to a time of the post-acquisition trigger event.

As previously mentioned, the live trigger circuit 120 and the post-acquisition circuit 125, while shown as two separate circuits, may be implemented with one set of hardware serving both the live trigger circuit function and the post-acquisition circuit function, for example, at different times. Alternatively, the live trigger circuit 120 and the post-acquisition circuit 125 are separate from each other, each of which may include similar circuits as the other.

Figure 2A:
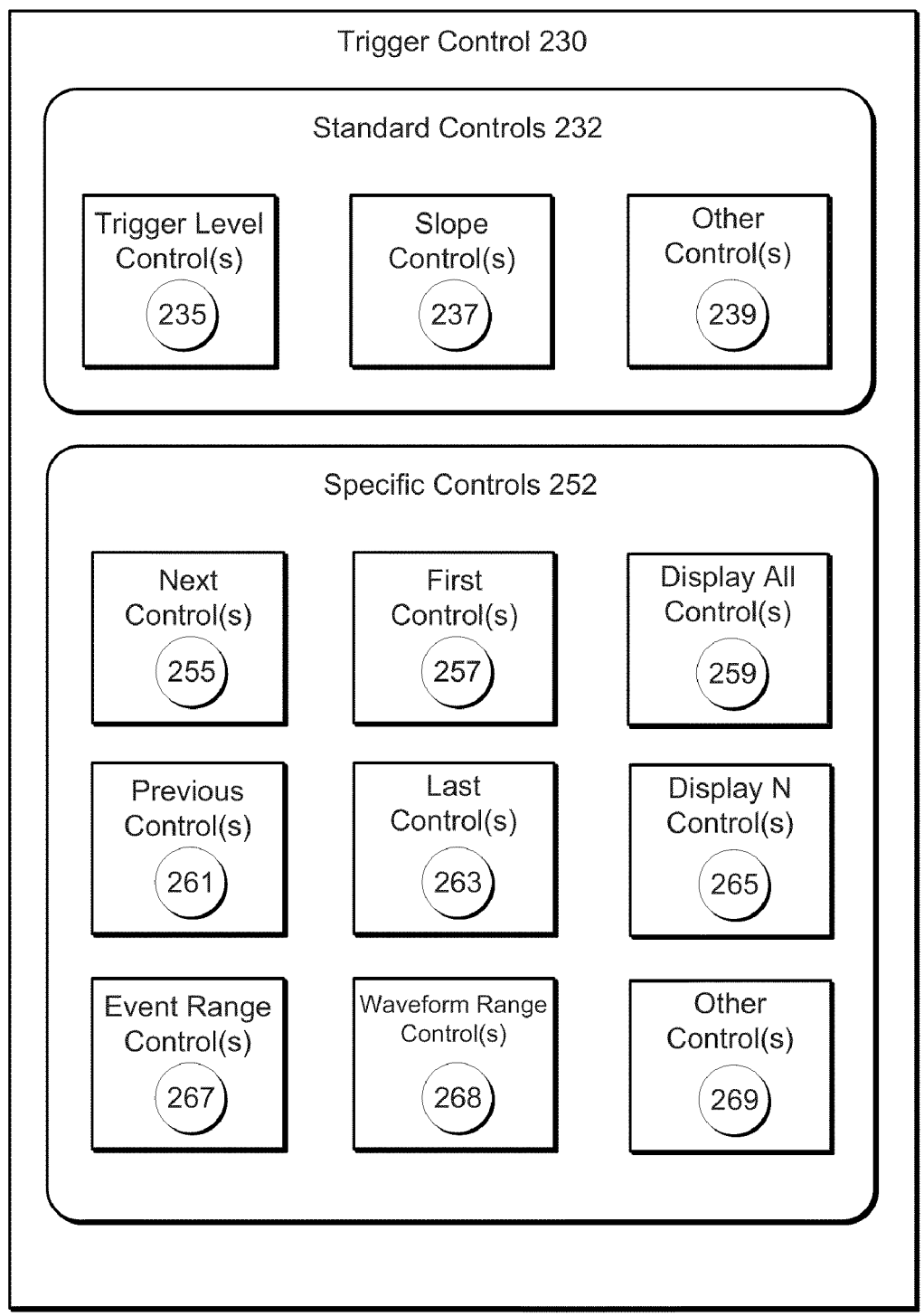
FIG. 2A is a block diagram illustrating additional example elements of the trigger control of FIG. 2.

FIG. 2A is a block diagram illustrating additional example elements of the trigger control 230 of FIG. 2. Standard controls 232 may include standard trigger level control(s) 235, standard slope control(s) 237 and/or other standard control(s) 239. Specific controls 252 may include next control(s) 255, first control(s) 257, display-all control(s) 259, previous control(s) 261, last control(s) 263, display N control(s) 265, event range control(s) 267, waveform range control(s) 268, and/or other specific control(s) 269.

The term "standard" as used herein refers to a type of physical controls with which skilled users of oscilloscopes are generally familiar, such as the trigger level control(s) 235 or the slope control(s) 237. The standard controls 232 can include a knob, a switch, an actuator, or any other suitable interface; however, the term "standard" does not necessarily impart any particular class of function performed by the controls 232. In other words, in one scenario, the "standard" controls 232 may be used to perform a function generally and immediately recognizable to the skilled user, or alternatively as will be further described herein, the "standard" controls may be used in conjunction with new implementations or embodiments of the present invention, such as in relation to a post-acquisition trigger mode.

The term "specific" as used herein refers to a type of physical controls that are specifically used while the oscilloscope is operating in a predefined mode. For example, the specific controls 252 may be used in a post-acquisition mode to further refine or otherwise configure how trigger events or waveforms are displayed on the display device 250. The specific controls 252 can include a knob, a switch, an actuator, or any other suitable interface.

The detailed operational features of each of the control illustrated in FIG. 2A will be described in additional detail below in conjunction with, for example, FIGS. 3-15.

Figure 3:
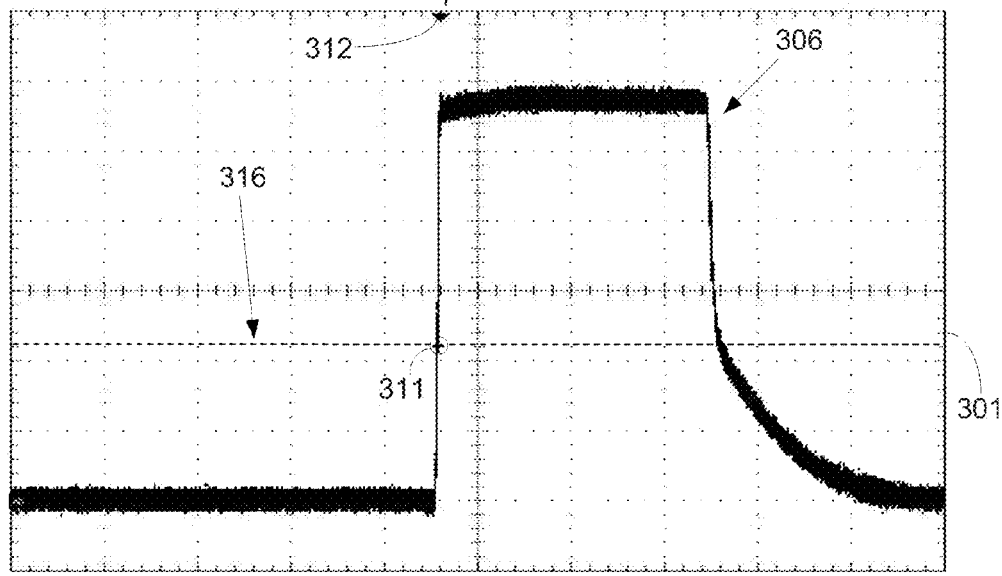
FIG. 3 is an example plot of a sampled electrical signal in a live-acquisition mode showing waveforms having associated therewith certain trigger-related aspects according to an embodiment of the invention.

FIG. 3 is an example plot 301 of a sampled electrical signal in a live-acquisition mode showing waveforms 306 having associated therewith certain trigger-related aspects according to an embodiment of the invention. While the example plot 301 shows pulsed waveforms for the sake of explaining one aspect of the invention, the inventive aspects are not limited thereto, and can include any number of possible waveform types, and any number of concurrently displayed waveforms. In the live-acquisition mode, waveforms 306 are continually being drawn as the acquisition and sampling of the electrical signal is ongoing. Each of the waveforms 306 are similar to one another, and when drawn together on example plot 301, appear as substantially a single waveform 306. In an alternative embodiment, there could be multiple different types of waveforms (not shown) acquired through different inputs 110 of the digital oscilloscope 100, and concurrently displayed.

The waveforms 306 have associated therewith certain trigger-related aspects. For example, live trigger criteria can be configured by a user. In this example plot, the live trigger criteria includes a trigger point 311, the position of which can be indicated on the display using a graphical "T" or other suitable marker. The trigger point 311 is associated with "time zero" graphical marker 312 and predefined trigger level 316. Further, the live trigger criteria associated with the waveforms 306 illustrated in FIG. 3 includes a rising-edge operating mode, thereby triggering on the rising-edge of the waveforms 306. The live trigger criteria cause a trigger event at 311, and the waveforms 306 are displayed at least from the trigger event 311 and onward in time. In other words, the waveforms 306 are displayed live where each waveform 306 is drawn on the display so that the trigger event 311 (determined by the live trigger criteria) is placed at the trigger time 312.

The user may configure the live trigger criteria using standard trigger control(s) 232 (of FIG. 2A). For example, the trigger level control 235 can be used to adjust the trigger level 316. Once the user has decided on the trigger level such as level 316, the trigger point 311 is selected and the user can use the slope control 237 to choose, for example, the rising-edge operating mode. The waveform will then automatically conform to the live trigger criteria.

Figure 4:
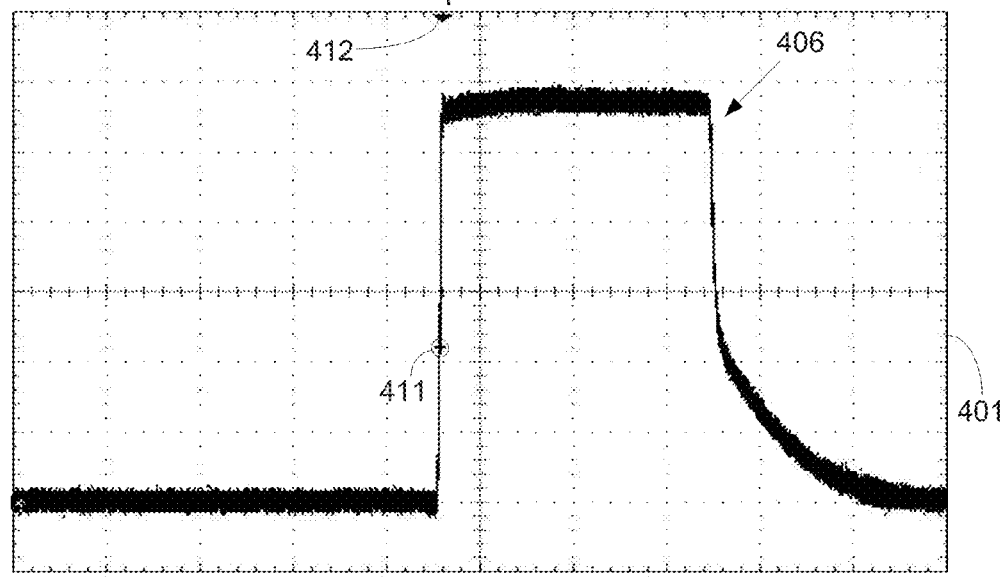
FIG. 4 is an example plot of a sampled electrical signal in a post-acquisition mode showing previously-acquired waveforms of FIG. 3 according to an embodiment of the invention.

FIG. 4 is an example plot 401 of a sampled electrical signal in a post-acquisition mode showing previously-acquired waveform(s) 406 according to an embodiment of the invention. When live-acquisition mode is halted, the display 401 will initially look substantially the same as the display 301 associated with the live-acquisition mode, except that new waveforms are not being drawn. In other words, in the post-acquisition mode, a user has manually stopped the live acquisition of data by using, for example, one of the input/output circuits 215 (FIG. 2) of the oscilloscope 100. While the example plot 401 shows pulsed waveforms for the sake of explaining one aspect of the invention, the inventive aspects are not limited thereto, and can include any number of possible waveform types, and any number of concurrently displayed waveforms.

In the post-acquisition mode, acquisition of the electrical signal has been halted, and the waveform(s) 406 are generated and displayed using digital samples from the data record 117 stored in the acquisition memory 115 (of FIGS. 1 and 2). In other words, the input (or channel) of the oscilloscope 100 associated with the waveform(s) 406 is no longer in a live mode, but rather, is in a post-acquisition mode.

As shown in FIG. 4, the waveform(s) 406 represent only a small portion of the digital samples stored in the data record 117. The amount of information shown in waveform(s) 406 can be adjusted, for example, by using horizontal or vertical scale controls (not shown). Making such adjustments allows the waveform(s) 406 and the trigger point 411 to "scroll" or otherwise be moved over the range of the display 401 or beyond the edges of the display 401. Such scrolling does not change the trigger criteria itself. For the sake of illustrating embodiments of the invention, the waveform(s) 406 will not be moved using the horizontal or vertical position controls, and the trigger "time zero" 412 associated with the trigger point 411 will be maintained substantially at a top-center or center position on the display 401.

Figure 5:
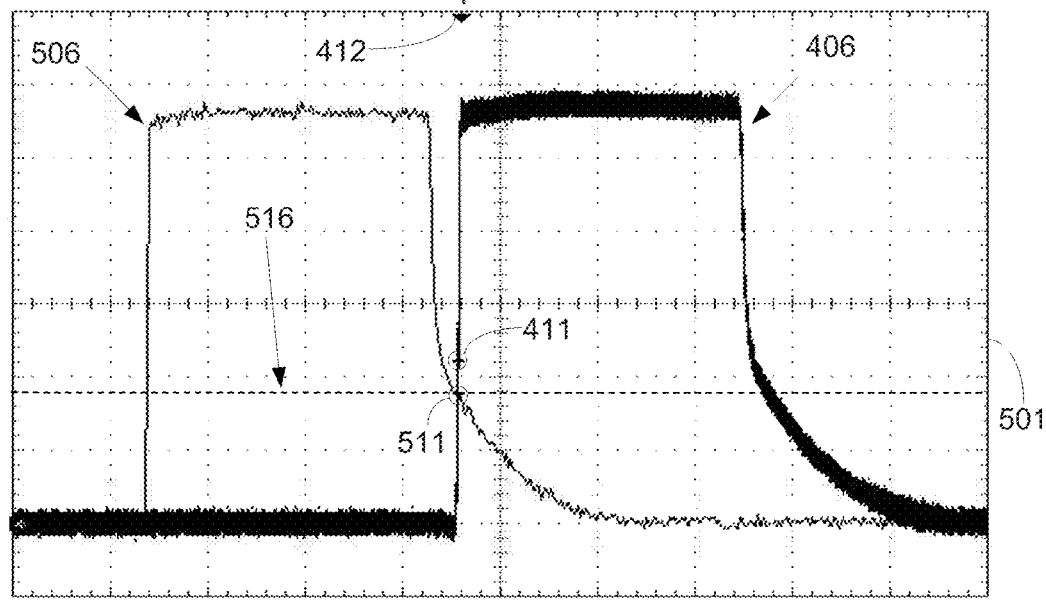
FIG. 5 is an example plot of a sampled electrical signal in a post-acquisition mode showing previously-acquired waveforms of FIG. 3 according to an embodiment of the invention.

FIG. 5 is an example plot 501 of a sampled electrical signal in a post-acquisition mode showing previously-acquired waveforms 406 and 506 according to an embodiment of the invention. When the acquisition of data has been halted, and when the user changes a standard trigger control 232, such as in this case adjusting the trigger level control 235 (of FIG. 2A) so that the trigger level 516 is adjusted slightly downward, and adjusting the slope control 237 from the rising-edge to a falling-edge operating mode, the last acquired waveform 506 is redrawn on the display according to the new trigger criteria, which now corresponds to the post-acquisition trigger criteria.

In other words, the post-acquisition trigger circuit 125 (of FIG. 1) detects a post-acquisition falling-edge trigger event 511 that is nearest to the previous trigger point 411 and adjusts the last-acquired waveform 506 so that the selected falling edge trigger event 511 is now displayed at the trigger time 412. For example, the post-acquisition trigger circuit 125 detects the post-acquisition falling-edge trigger event 511 in the data record 117 based on the post-acquisition trigger criteria selected by the user, and causes an automatic adjustment (e.g., shifting) of the last acquired waveform 506 to conform with a time of the post-acquisition trigger event 511. Any of the standard trigger controls 232 can be used to adjust the post-acquisition trigger criteria. In so doing, the post-acquisition trigger circuit 125 can adjust the last acquired waveform 506 to match the newly selected trigger criteria, after the acquisition of data has halted, and using one or more standard trigger control 232.

Further relating to the controls, the trigger control 230 (of FIGS. 2 and 2A) is used to configure trigger criteria for both a live trigger event and a post-acquisition trigger event. The trigger control 230 can include standard trigger controls, as previously mentioned. The standard trigger level control 235 varies the voltage on the waveform at which point a trigger event will be generated. The trigger control 230 may include other controls such as the slope control 237, which allows the user to select the rising-edge or falling-edge operating mode at the selected trigger level.

The trigger level control 235 may be used to select one trigger point for the live trigger event and to select another trigger point for the post-acquisition trigger event. In the post-acquisition mode, the post-acquisition trigger circuit 125 can detect a post-acquisition trigger event in the data record based on predefined trigger criteria selected by the user using the trigger control 230, such as the standard trigger level control 235 and the standard slope control 237. In this manner, the user can use trigger controls with which he or she has the most familiarity to perform triggering operations both in the live trigger mode and in the post-acquisition trigger mode, i.e., after the acquisition of data has been stopped.

The previously acquired waveform(s) 406 are preferably removed when a user adjusts a control during the post-acquisition mode, and the last acquired waveform 506 is displayed according to the post-acquisition trigger criteria. Nevertheless, in an alternative embodiment, the previously acquired waveform(s) 406 can remain on the display 501 to provide a comparison or reference to the automatically adjusted last acquired waveform 506, among other reasons. Alternatively, the previously acquired waveform(s) 406 can be dimmed, or as mentioned above, removed from the display 501. In addition, although the waveform 506 is referred to as the "last" acquired waveform, any of the waveforms that were previously acquired can be automatically or manually selected as the waveform 506, which need not be the "last" acquired waveform, and can then be automatically adjusted based on the post-acquisition trigger criteria.

Figure 6:
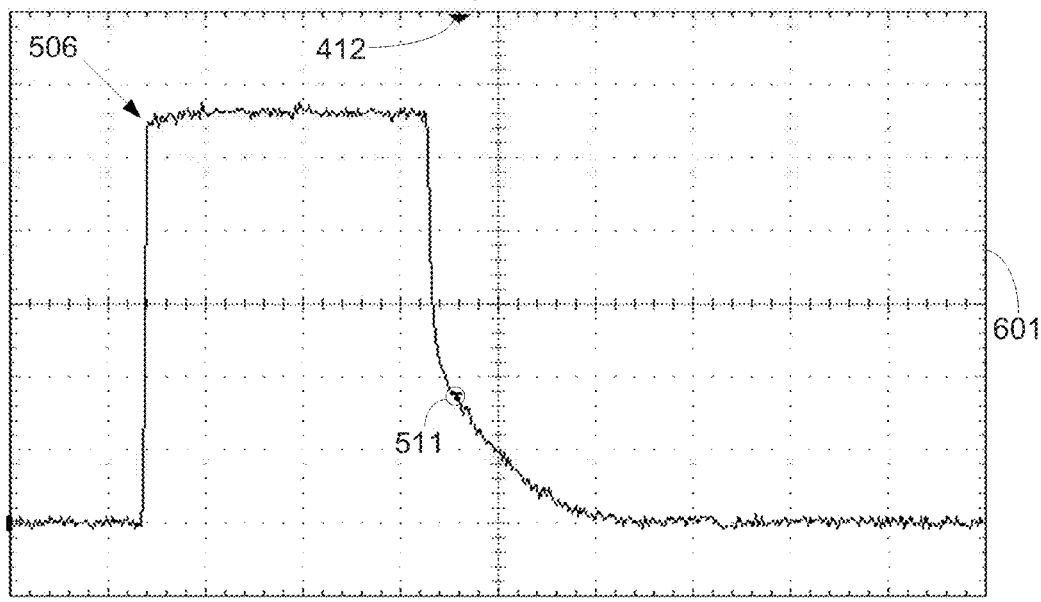
FIG. 6 is an example plot of a sampled electrical signal in a post-acquisition mode showing a previously-acquired waveform according to an embodiment of the invention.

FIG. 6 is an example plot 601 of a sampled electrical signal in a post-acquisition mode showing previously-acquired waveform 506 according to an embodiment of the invention. Here, the last-acquired waveform 506 is displayed without displaying the previously acquired waveform(s) 406, after the user has selected and applied the post-acquisition trigger criteria. The post-acquisition trigger circuit 125 has found the post-acquisition falling-edge trigger event 511 that was nearest to the previous trigger point 411 and has caused the last acquired waveform 506 to be re-drawn or otherwise re-positioned while in the post-acquisition or stopped mode.

Figure 7:
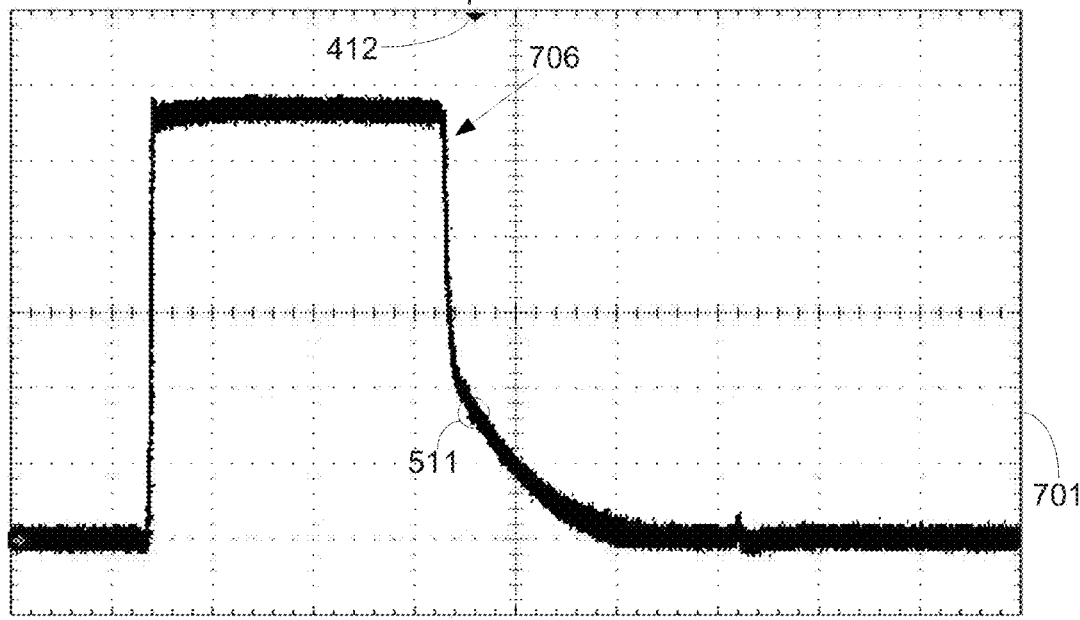
FIG. 7 is an example plot of a sampled electrical signal in a live-acquisition mode showing waveforms having associated therewith trigger-related aspects as selected during the post-acquisition mode.

FIG. 7 is an example plot 701 of a sampled electrical signal in a live-acquisition mode showing waveform(s) 706 having associated therewith trigger-related aspects as selected during the post-acquisition mode. Specifically, the trigger criteria as selected during the post-acquisition mode, such as trigger point 511, is shown operating on the waveform(s) 706 in a live-acquisition mode. In other words, the user was able to preview the effect that the post-acquisition trigger criteria would have on live-acquired waveforms, such as waveform(s) 706.

To further appreciate the various live trigger criteria and post-acquisition trigger criteria, and how they can interrelate, consider that the live trigger criteria operating on the waveform(s) 706 can essentially match the post-acquisition trigger criteria as selected and previewed by the user during the post-acquisition mode. In addition, the user can use the same trigger controls to adjust both the live trigger criteria and the post-acquisition trigger criteria. An adjustment to the post-acquisition trigger criteria can automatically change the live-acquisition trigger criteria. Similarly, an adjustment to the live-acquisition trigger criteria can automatically change the post-acquisition trigger criteria. Although the trigger controls used to adjust the live-acquisition and post-acquisition trigger criteria need not be identical, such is the preferred approach for intuitive ease-of-use of the digital oscilloscope 100.

Figure 8:
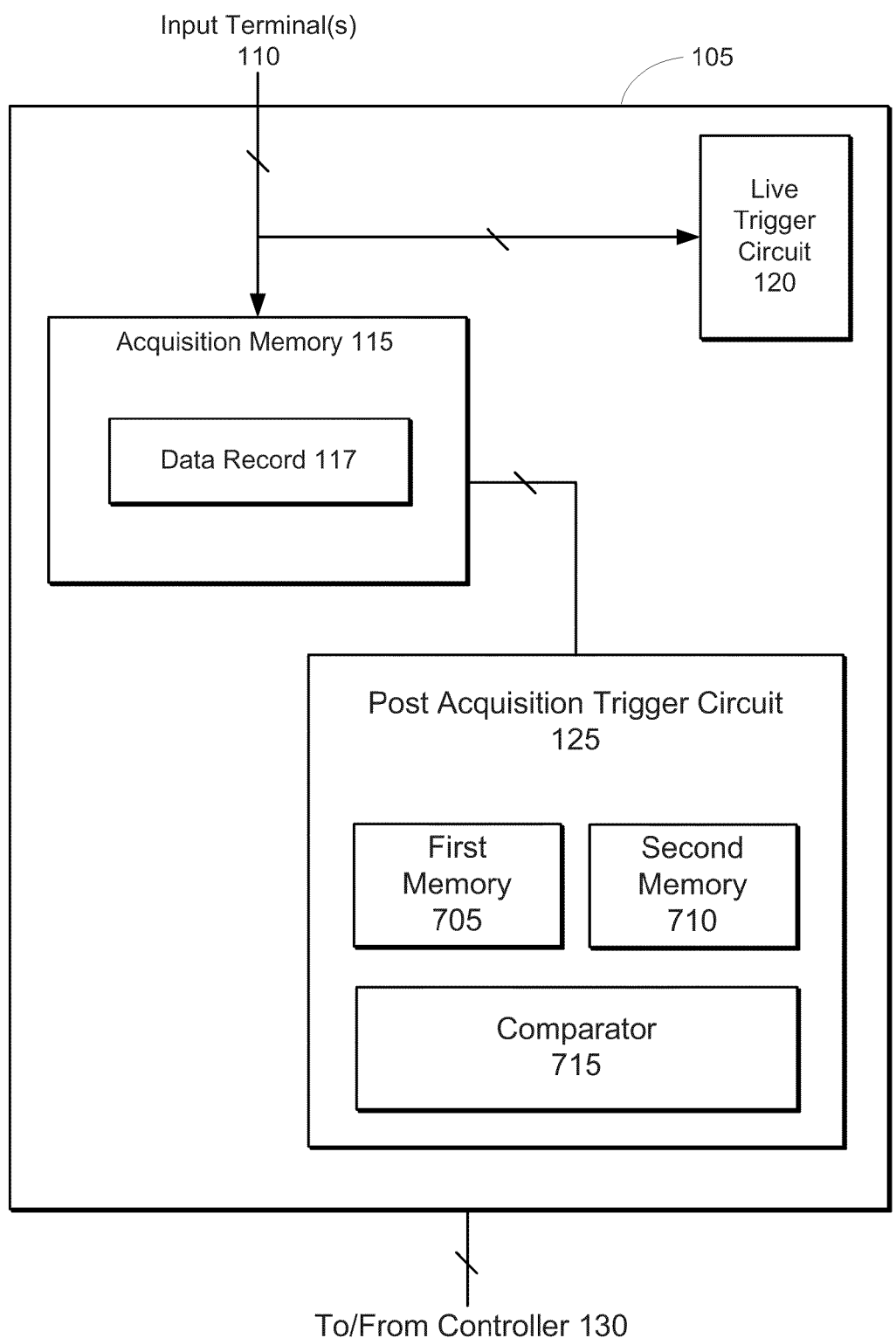
FIG. 8 is a block diagram illustrating additional example elements of the post-acquisition trigger circuit of FIG. 1.

FIG. 8 is a block diagram illustrating additional example elements of the post-acquisition trigger circuit 125 of FIG. 1. For example, the post-acquisition trigger circuit 125 may include a first memory 705 and a second memory 710. While two memories are shown for exemplary purposes, it should be understood that any number of memories may be included in the post-acquisition trigger circuit. Some of the elements shown in FIG. 8 correspond to elements previously discussed with reference to FIG. 1, and therefore, need not be repeated.

The first memory 705 can store a trigger point immediately before a previous trigger point, and the second memory can store a trigger point immediately after the previous trigger point. A comparator 715 can compare the trigger point immediately before the previous trigger point to the previous trigger point, and can compare the trigger point immediately after the previous trigger point to the previous trigger point. This technique will be further described with reference to FIGS. 9 to 13.

Figure 9:
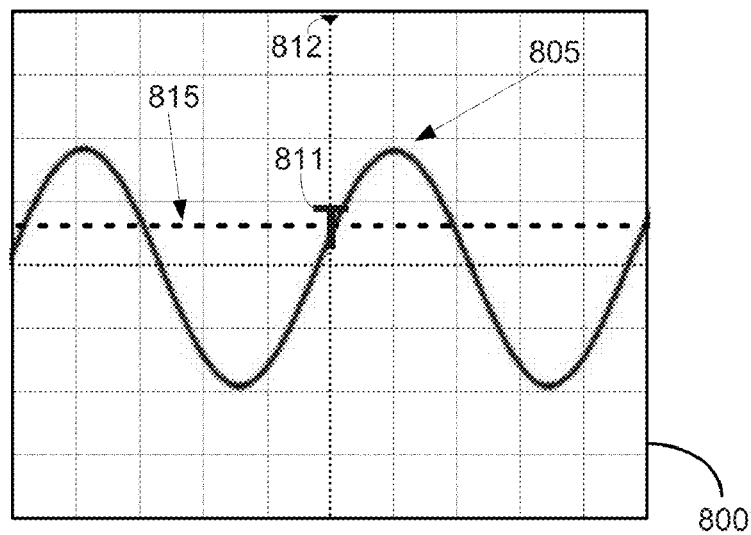
FIG. 9 is an example plot of a sampled electrical signal showing one or more waveforms in a live-acquisition mode having associated therewith certain trigger-related aspects according to yet another embodiment.

FIG. 9 is an example plot 800 of a sampled electrical signal showing one or more waveforms 805 in a live-acquisition mode having associated therewith certain trigger-related aspects according to yet another embodiment. While the example plot 800 shows a sinusoidal wave for the sake of explaining one aspect of the invention, the inventive aspects are not limited thereto, and can include any number of possible waveform types, and any number of concurrently displayed waveforms. In the live-acquisition mode, the one or more waveforms 805 are continually being drawn as the acquisition and sampling of the electrical signal is ongoing. In an alternative embodiment, there could be multiple different types of waveforms (not shown) acquired through different inputs 110 of the digital oscilloscope 100, and concurrently displayed.

The one or more waveforms 805 have associated therewith certain trigger-related aspects. For example, live trigger criteria can be configured by a user. In this example plot, the live trigger criteria includes a trigger point 811, the position of which can be indicated on the display using a graphical "T" or other suitable marker. The trigger point 811 is associated with "time zero" marker 812 and predefined trigger level 815. Further, the live trigger criteria associated with the waveforms 805 illustrated in FIG. 9 includes a rising-edge operating mode, thereby triggering on the rising-edge of the one or more waveforms 805. The live trigger criteria cause a trigger event at 811, and the one or more waveforms 805 are displayed from the trigger event 811 and onward in time. In other words, the one or more waveforms 805 are displayed live where each of the one or more waveforms 805 is drawn on the display so that the trigger event 811 (determined by the live trigger criteria) is placed at the trigger time 812.

The user may configure the live trigger criteria using trigger control 230 (of FIG. 2). For example, the trigger level control 235 can be used to adjust the trigger level 815. Once the user has decided on the trigger level such as level 815, the trigger point 811 is selected and the user can use the slope control 237 to choose, for example, the rising-edge operating mode, such as shown here. The waveform will then automatically conform to the live trigger criteria.

Figure 10:
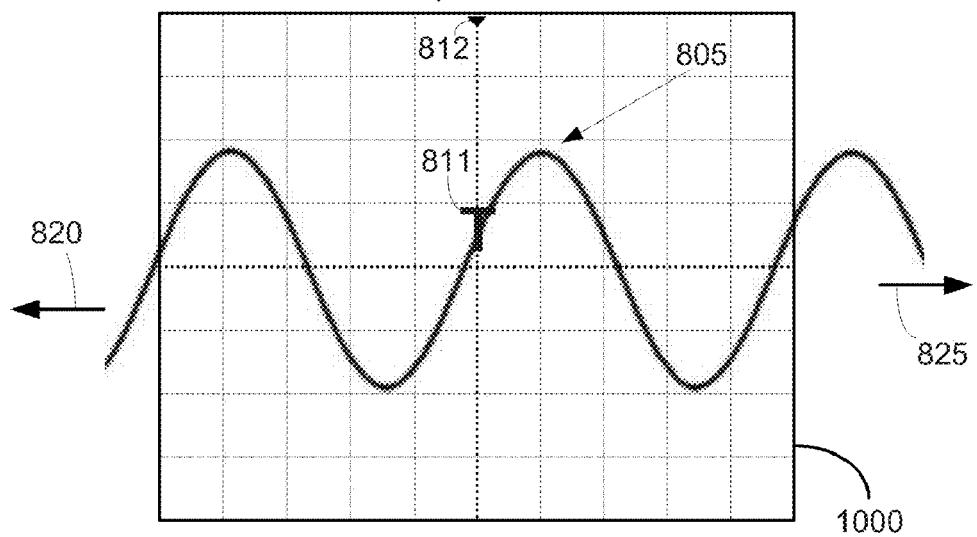
FIG. 10 is an example plot of a sampled electrical signal in a post-acquisition mode showing previously-acquired one or more waveforms of FIG. 9 according to an embodiment of the invention.

FIG. 10 is an example plot 1000 of a sampled electrical signal in a post-acquisition mode showing previously-acquired one or more waveforms 805 according to an embodiment of the invention. When live-acquisition mode is halted, the display 1000 will initially look substantially the same as the display 800 associated with the live-acquisition mode, except that new waveforms are not being drawn. In other words, in the post-acquisition mode, a user has manually stopped the live acquisition of data by using, for example, one of the input/output circuits 215 (FIG. 2) of the oscilloscope 100. While the example plot 1000 shows a sinusoidal waveform for the sake of explaining one aspect of the invention, the inventive aspects are not limited thereto, and can include any number of possible waveform types, and any number of concurrently displayed waveforms.

In the post-acquisition mode, acquisition of the electrical signal has been halted, and the one or more waveforms 805 are generated and displayed using digital samples from the data record 117 stored in the acquisition memory 115 (of FIGS. 1 and 2). In other words, the input (or channel) of the oscilloscope 100 associated with the one or more waveforms 805 is no longer in a live mode, but rather, is in a post-acquisition mode.

As shown in FIG. 10, the one or more waveforms 805 represent only a small portion of the digital samples stored in the data record 117. The lines 820 and 825 signify that the data record represents much more time than the time interval of interest that can be displayed at one time on the display. The amount of information shown in the one or more waveforms 805 can be adjusted, for example, by using horizontal or vertical scale controls (not shown). Making such adjustments allows the one or more waveforms 805 and the trigger point 811 to "scroll" or otherwise be moved over the range of the display 1000 or beyond the edges of the display 1000. Such scrolling does not change the trigger criteria itself. For the sake of illustrating embodiments of the invention, the one or more waveforms 805 will not be moved using the horizontal or vertical position controls, and the trigger "time zero" 812 associated with the trigger point 811 will be maintained substantially at a top-center or center position on the display 1000.

Figure 11:
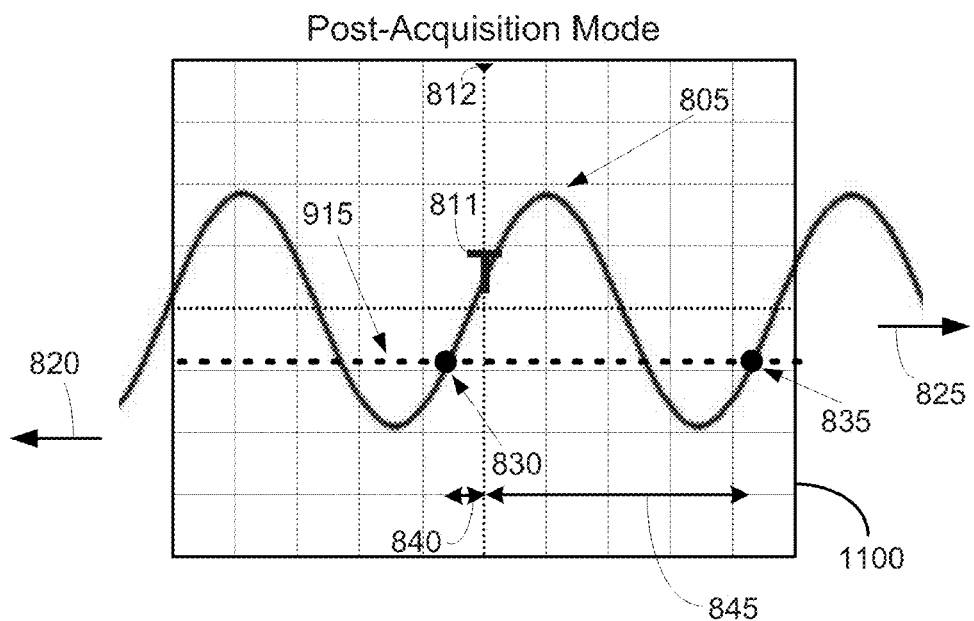
FIG. 11 is an example plot of a sampled electrical signal in a post-acquisition mode showing the previously-acquired one or more waveforms of FIG. 9 according to an embodiment of the invention.

FIG. 11 is an example plot 1100 of a sampled electrical signal in a post-acquisition mode showing the previously-acquired one or more waveforms 805 according to an embodiment of the invention. When the acquisition of data has been halted, and when the user changes a trigger control, such as in this case adjusting the trigger level control 235 (of FIG. 2A) so that the trigger level 915 is adjusted downward, the post-acquisition trigger control circuit 125 the post-acquisition trigger circuit can automatically determine the next post-acquisition trigger point.

For example, the previous trigger event 811 is associated with a previous trigger point 811 selected by the user. The first memory 705 (of FIG. 7) of the post-acquisition trigger circuit 125 can store a trigger point 830, which is immediately before the previous trigger point 811. The second memory 710 of the post-acquisition trigger circuit 125 can store a trigger point 835, which is immediately after the previous trigger point 811. A comparator 715 of the post-acquisition trigger circuit 125 can compare the trigger point 830 immediately before the previous trigger point 811 to the previous trigger point 811, and can compare the trigger point 835 immediately after the previous trigger point 811 to the previous trigger point 811. In this manner, the comparator 715 can select the trigger point closest to the previous trigger 811 point as a new trigger point, in this case, trigger point 830. For further clarification, consider that the distance 840 between point 830 and point 811 is shorter than the distance 845 between point 835 and 811. Therefore, the trigger point 830 is automatically selected as the new trigger point.

Figure 12:
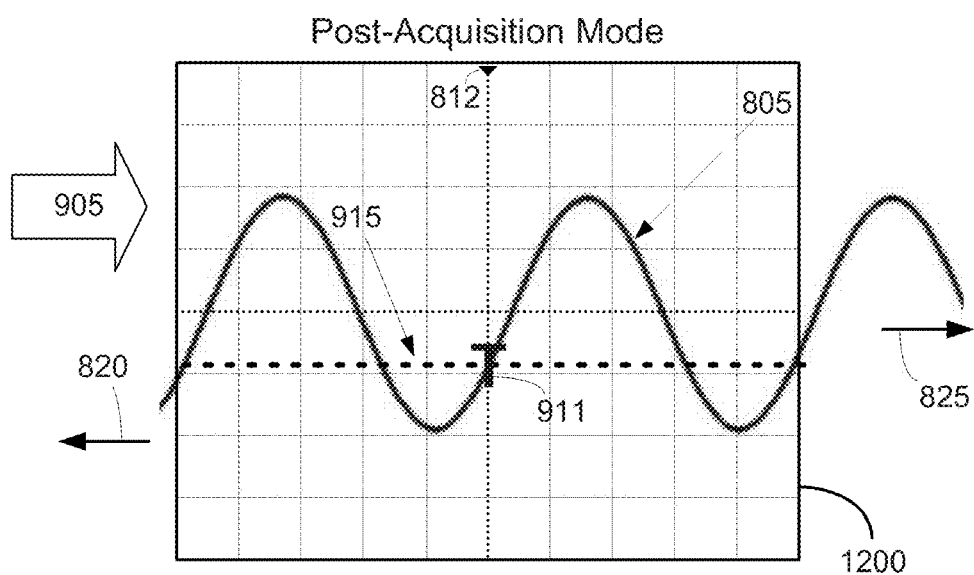
FIG. 12 is an example plot of a sampled electrical signal in a post-acquisition mode showing the previously-acquired one or more waveforms of FIG. 9 according to an embodiment of the invention.

FIG. 12 is an example plot 1200 of a sampled electrical signal in a post-acquisition mode showing the previously-acquired one or more waveforms 805 according to an embodiment of the invention. After the acquisition of data has been halted, and after the user has changed a trigger control, such as in this case adjusting the trigger level control 235 (of FIG. 2A), one or more of the waveforms 805 is redrawn on the display according to the new trigger criteria, which now corresponds to the post-acquisition trigger criteria.

In other words, the post-acquisition trigger circuit 125 (of FIG. 1) detects a post-acquisition rising-edge trigger event 830 that is nearest to the previous trigger point 811 and adjusts one or more of the waveforms 805 so that the selected rising-edge trigger event 911 is now displayed at the trigger time 812. For example, the post-acquisition trigger circuit 125 detects the post-acquisition rising-edge trigger event 830 stored in the first memory 705 based on the post-acquisition trigger criteria selected by the user, and causes an automatic adjustment (e.g., shifting) of one or more of the waveforms 805 to conform with a time of the post-acquisition trigger event 911.

More specifically, the one or more waveforms 805 is shifted as indicated by the arrow 905 so that the trigger event 911 now corresponds to the trigger criteria as previously selected by the user, and as automatically applied using the comparator 715 of the post-acquisition trigger circuit 125. Any of the standard trigger level controls 235 can be used to adjust the post-acquisition trigger criteria. In so doing, the post-acquisition trigger circuit 125 can adjust one or more of the waveforms 805 to match the newly selected trigger criteria, after the acquisition of data has halted, and using one or more standard trigger control 230.

Figure 13:
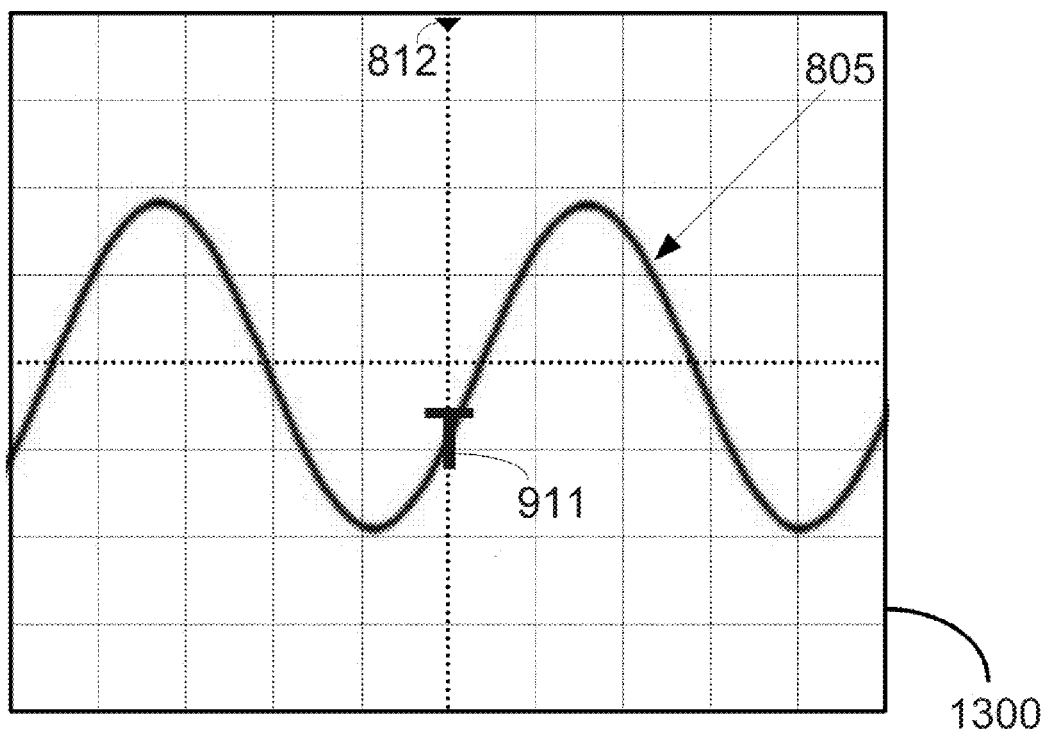
FIG. 13 is an example plot of a sampled electrical signal in a live-acquisition mode showing the one or more waveforms having associated therewith trigger-related aspects as selected during the post-acquisition mode.

FIG. 13 is an example plot 1300 of a sampled electrical signal in a live-acquisition mode showing the one or more waveforms 805 having associated therewith trigger-related aspects as selected during the post-acquisition mode. Specifically, the trigger criteria as selected during the post-acquisition mode, such as trigger point 911, is shown operating on the one or more waveforms 805 in a live-acquisition mode. In other words, the user was able to preview the effect that the post-acquisition trigger criteria would have on live-acquired waveforms, such as the one or more waveforms 805.

To further appreciate the various live trigger criteria and post-acquisition trigger criteria, and how they can interrelate, consider that the live trigger criteria operating on the one or more waveforms 805 essentially match the post-acquisition trigger criteria as selected and previewed by the user during the post-acquisition mode. In addition, the user can use the same trigger controls to adjust both the live trigger criteria and the post-acquisition trigger criteria. An adjustment to the post-acquisition trigger criteria can automatically change the live-acquisition trigger criteria. Similarly, an adjustment to the live-acquisition trigger criteria can automatically change the post-acquisition trigger criteria. Although the trigger controls used to adjust the live-acquisition and post-acquisition trigger criteria need not be identical, such is the preferred approach for intuitive ease-of-use of the digital oscilloscope 100.

Figure 14:
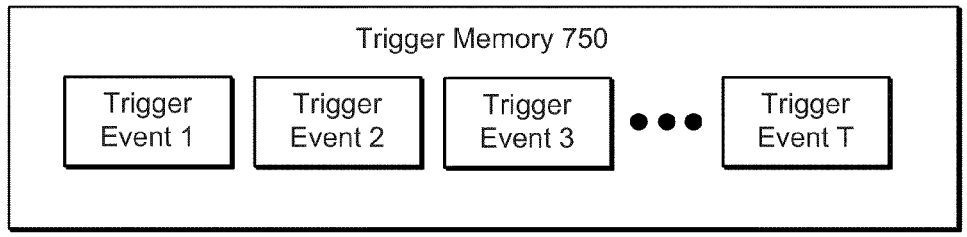
FIG. 14 is a block diagram illustrating an example configuration of a memory included in the post-acquisition trigger circuit of FIG. 8.

FIG. 14 is a block diagram illustrating an example configuration of a memory 750, which may be included in the post-acquisition trigger circuit 125 of FIG. 8. The memory 750 can store information about all post-acquisition trigger events T associated with a previously acquired data record, such as trigger event 1, trigger event 2, trigger event 3, etc., through trigger event T. The information can include a time or place of each of the post-acquisition trigger events.

Figure 15:
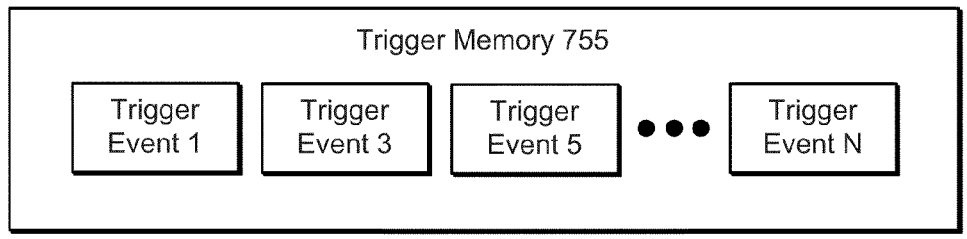
FIG. 15 is a block diagram illustrating another example configuration of a memory included in the post-acquisition trigger circuit of FIG. 8.

FIG. 15 is a block diagram illustrating another example configuration of a memory 755, which can be included in the post-acquisition trigger circuit 125 of FIG. 8. Because of limited memory space, in some cases only a portion of the trigger events can be saved. For example, the memory 755 can store information about a portion of the post-acquisition events, such as trigger event 1, trigger event 3, trigger event 5, and trigger event N. In other words, the memory 755 may store information about N post-acquisition trigger events, where N is less than the total number of post-acquisition trigger events T associated with the data record. The information can include a time or place of each of the post-acquisition trigger events.

Figure 16:
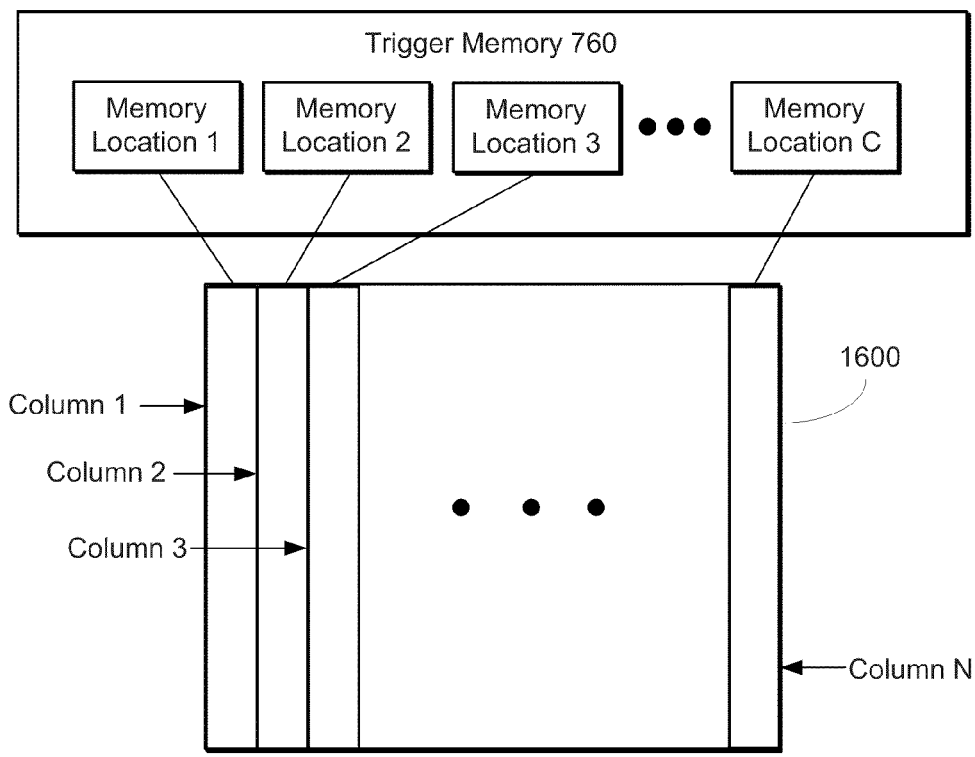
FIG. 16 is a block diagram illustrating yet another example configuration of a memory included in the post-acquisition trigger circuit of FIG. 8, and its relation to columns of a display.

FIG. 16 is a block diagram illustrating yet another example configuration of a memory 760, which can be included in the post-acquisition trigger circuit 125 of FIG. 8, and its relation to columns of a display 1600. The memory 760 may have one memory location for each column of the display 1600. Each of the memory locations, such as memory location 1, memory location 2, memory location 3, etc., through memory location C, may be associated with a corresponding one of the columns, such as column 1, column 2, column 3, etc., through column N, of the display 1600. The memory location for each column can store information regarding whether a trigger event occurred at the time or place of the associated column. In this embodiment, the memory 760 need only be as large as the width of the display associated with the display device 250. In other words, when there is a one-to-one mapping of memory locations to columns, the value of N equals the value of C. A width of a "column" can be larger or smaller than a pixel. In other words, the width of a column can be less than a width of a single pixel, or alternatively, the width of a column can be greater than or equal to the width of a pixel. Interpolation or fractional mapping can be used to map one or more memory locations to each column, or to map a single memory location to one or more columns.

Figure 17:
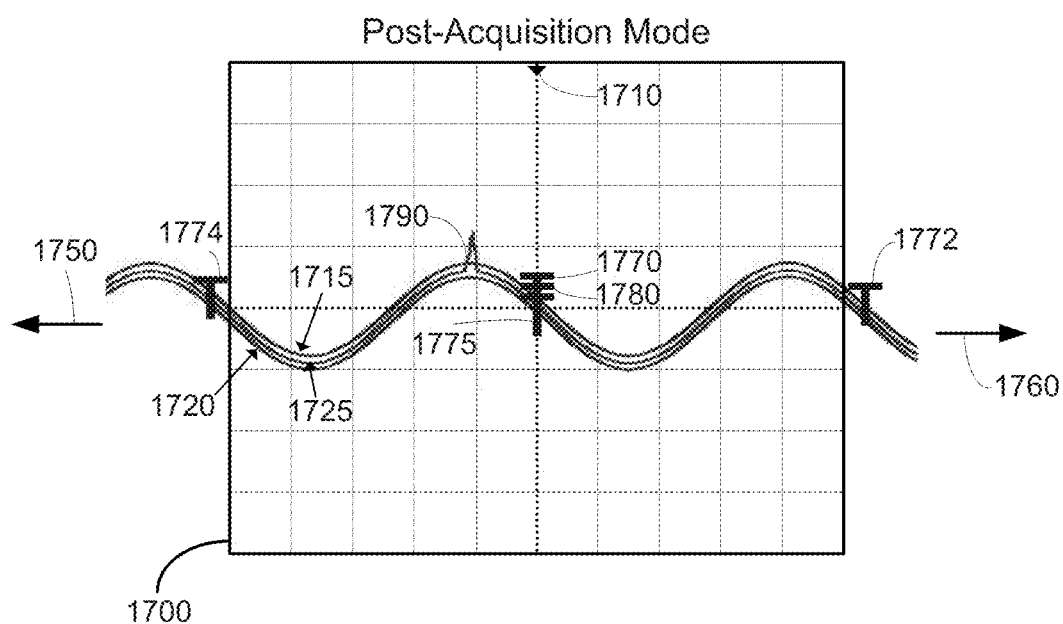
FIGS. 17 and 18 are example plots of sampled electrical signals in a post-acquisition mode showing previously-acquired waveforms and associated trigger related aspects, according to an embodiment of the invention.
Figure 18:
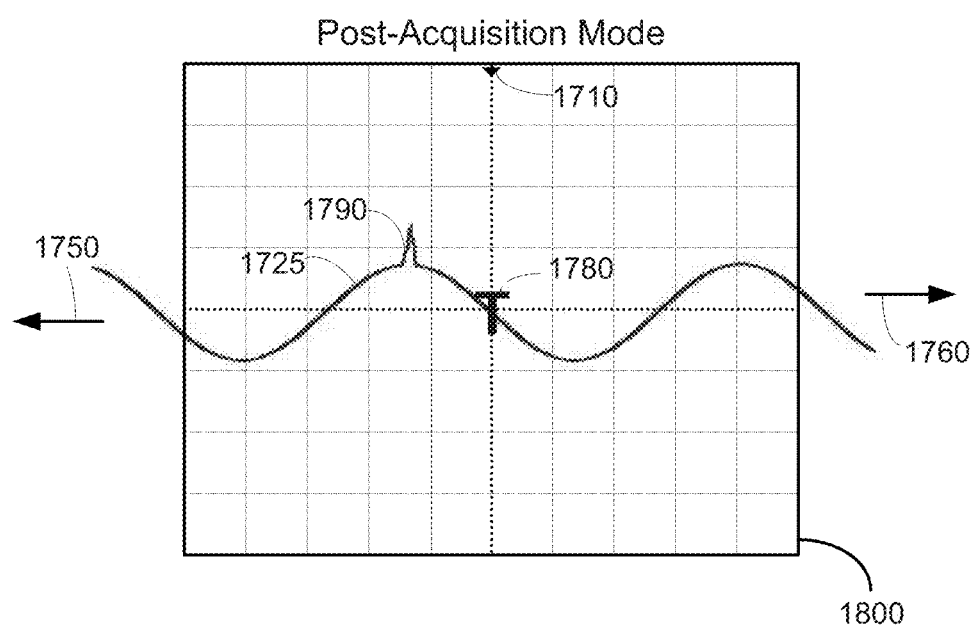

FIGS. 17 and 18 are example plots 1700 and 1800 of sampled electrical signals in a post-acquisition mode showing previously-acquired waveforms (e.g., 1715, 1720, and 1725) and associated trigger related aspects, according to an embodiment of the invention. The following description makes reference to both of FIGS. 17 and 18.

The lines 1750 and 1760 signify that the data record represents much more time than the time interval of interest that can be displayed at one time on the display, for any given waveform. While the example plots 1700 and 1800 show sinusoidal waves for the sake of explaining one aspect of the invention, the inventive aspects are not limited thereto, and can include any number of possible waveform types, and any number of concurrently displayed waveforms.

A trigger circuit, such as the trigger circuit 125 of FIG. 1, can detect one or more post-acquisition trigger events in the data record based on trigger criteria, as discussed above. A display device, such as display device 250 of FIG. 2, can output a display, such as the display 1700 of FIG. 17 or 1800 of FIG. 18. The display device can adjust the display of the one or more post-acquisition trigger events and waveforms associated with a data record in response to one or more configurable trigger controls, such as the standard controls 232 or the specific controls 252 mentioned above with reference to FIG. 2A.

The trigger controls can be configured by a user to cause more than one trigger event, such as trigger events 1770, 1775, or 1780 to be displayed simultaneously with more than one waveform from the same data record, such as waveforms 1715, 1720, and 1725. For example, the display-all control(s) 259 can cause all post-acquisition trigger events associated with the data record to be simultaneously displayed. Alternatively, the display N control(s) 265 can cause N number of post-acquisition trigger events associated with the data record to be simultaneously displayed.

The display device 250 can mark each of the post-acquisition trigger events with a graphical marker, such as marker 1710, toward a top area or top center area of the display device, and/or the letter T, or some other suitable marker, as shown at 1770, 1775, or 1780. The graphical marker 1710 corresponds to a trigger time of the post-acquisition trigger event or events. There can be more than one graphical marker corresponding to more than one trigger time of the post-acquisition trigger events, any of which can be simultaneously displayed.

In another example embodiment, the event range control(s) 267 is configurable to gradually adjust a range of the number of post-acquisition trigger events (e.g., 1770, 1775, and 1780) associated with the data record to be simultaneously displayed. Alternatively, the waveform range control(s) 268 is configurable to gradually adjust a range of the number of waveforms (e.g., 1715, 1720, and 1725) associated with the data record to be simultaneously displayed. The event range control(s) 267 and the waveform range control(s) 268 can be one in the same range control or controls, or can be different controls. These controls allow the range or ranges to be decreased or otherwise increased or varied until just a single waveform 1725 associated with a single trigger event 1780 is displayed, as shown in FIG. 18.

In this manner, by simultaneously viewing multiple waveforms from the same data record, and then narrowing the waveforms to a single waveform of interest, any unusual waveform such as 1725 or unusual portion of the waveform such as spike 1790 can be quickly found and viewed. In other words, the user can quickly find the unusual waveform 1725 by reducing the range until just the unusual waveform 1725 is displayed, as shown in FIG. 18.

The term "unusual" as used herein can refer to any portion of the waveform that might be considered to possess an anomaly by the user, or is otherwise of interest to the user. Examples can include unusual variances in a pulse width, a fall time, an undershoot, a spike, a runt, or any other type of anomalous waveform. It should be understood that the waveform 1725 is only representative of a waveform that can have one or more of the mentioned unusual aspects.

The waveforms such as 1715, 1720, and 1725 can be from the same data record and simultaneously displayed. The configurable trigger controls can be used to adjust how the waveforms are displayed. For example, the next control(s) 255 (of FIG. 2A) can cause a next post-acquisition trigger event 1772 associated with the data record to found and displayed. For example, the next control(s) 255 can cause a waveform, such as 1715, to automatically shift so that the post-acquisition trigger event 1772 is displayed toward the center column of the display. Alternatively, the next control(s) 255 can cause one or more waveforms such as 1715, 1720, and 1725 to automatically shift to the next post-acquisition trigger event.

Similarly, the previous control(s) 261 can cause a previous post-acquisition trigger event 1774 associated with the data record to found and displayed. For example, the previous control(s) 261 can cause a waveform, such as 1715, to automatically shift so that the post-acquisition trigger event 1774 is displayed toward the center column of the display. Alternatively, the previous control(s) 261 can cause one or more waveforms such as 1715, 1720, and 1725 to automatically shift to the previous post-acquisition trigger event.

As additional examples, the first control(s) 257 and last control(s) 263 can find and display the first and last post-acquisition trigger events, respectively. Other standard control(s) 239 or specific control(s) 269 may be used to manipulate how the trigger events or the waveforms are displayed.

Figure 19:
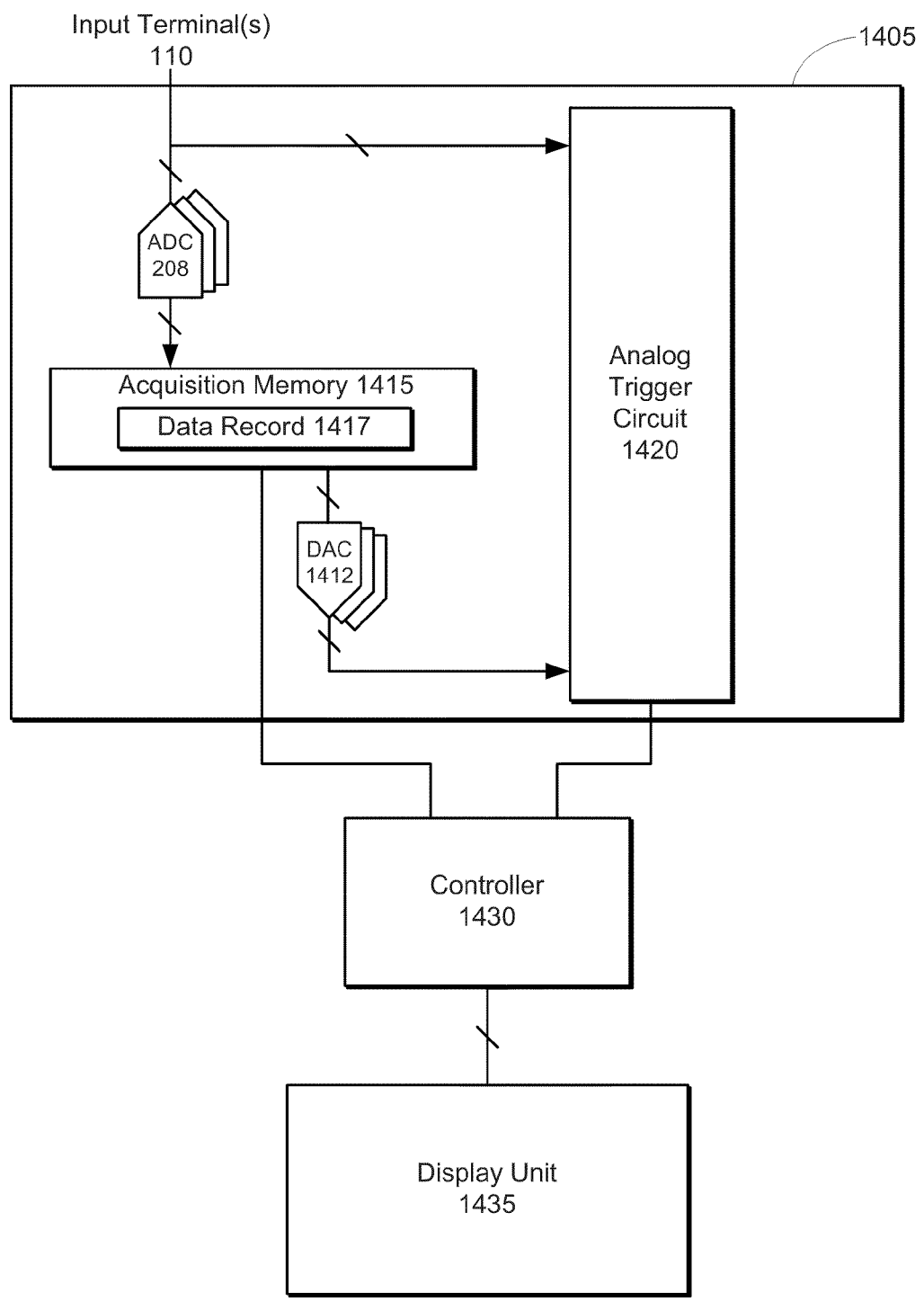
FIG. 19 is a block diagram illustrating a test and measurement instrument including an acquisition memory, an analog trigger circuit, and various analog-to-digital converters and digital-to-analog converters, according to an example embodiment.

FIG. 19 is a block diagram illustrating a test and measurement instrument 1400 including an acquisition memory 1415, an analog trigger circuit 1420, and various analog-to-digital converters (ADCs) 208 and digital-to-analog converters (DACs) 1412, according to an example embodiment. Some of the components of the acquisition and trigger unit 1405, the controller 1430, and the display unit 1435 correspond to similar components discussed above and a detailed description need not be repeated. The acquisition memory 1415 may acquire one or more digital data samples and store them as at least one data record 1417.

One or more ADCs 208 may be associated with the input terminal(s) 110. The one or more ADCs 208 may receive a signal under test and produce digital samples from the signal under test, and transfer the digital samples to the acquisition memory 1415. An analog trigger circuit 1420 may have an input coupled to the input terminal(s) 110, and can detect a live trigger event in the signal under test based on first trigger criteria and can cause an automatic adjustment to the waveform to conform with a time of the live trigger event. In addition, the acquisition and trigger unit 1405 may include one or more DACs 1412 to receive the digital samples from the acquisition memory 1417 and to produce a converted analog signal, which can be transmitted to the analog trigger circuit 1420 for post-acquisition processing.

The analog trigger circuit 1420 is configured to receive the converted analog signal to detect a post-acquisition trigger event in the data record 1417 based on second trigger criteria, and to cause an automatic adjustment to the waveform to conform with a time of the post-acquisition trigger event. In this manner, a single trigger circuit may be used to detect and process live trigger events as well as post-acquisition trigger events.

Similar trigger controls and behavior as described in detail above can be used to control the analog trigger circuit 1420 to achieve similar outcomes. For the sake of brevity, a detailed description of the various controls and behavior need not be repeated.

Figure 20:
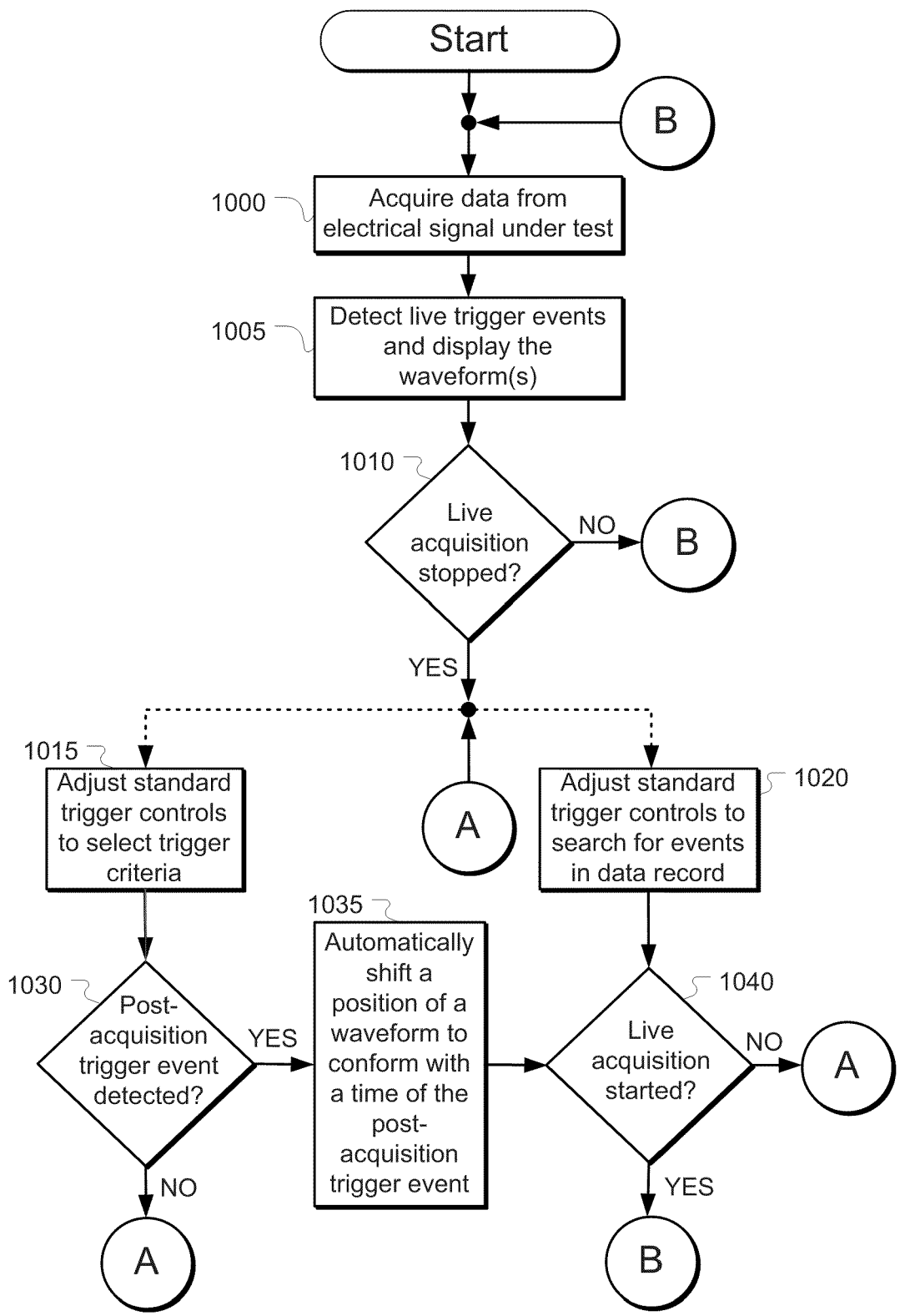
FIG. 20 is a flow diagram illustrating a technique for configuring post-acquisition triggers and adjusting a corresponding waveform according to an example embodiment.

FIG. 20 is a flow diagram illustrating a technique for configuring post-acquisition triggers and adjusting a corresponding waveform according to an example embodiment. The procedure may begin by acquiring data from an electrical signal under test at 1000. The flow then proceeds to 1005 where any live trigger events are detected and the waveform(s) are adjusted accordingly. At 1010, a determination is made whether live acquisition of data has stopped. This determination can be responsive to user input, or determined automatically. If the live-acquisition mode has not been stopped, then the flow takes the path through 'B' and continues to acquire data from the electrical signal under test.

Otherwise, the oscilloscope enters the post-acquisition mode, and the flow proceeds along one of two paths 1015 or 1020 based on user input. If the user adjusts the standard trigger controls to select trigger criteria at 1015, then the flow proceeds to 1030 where a determination is made whether a post-acquisition trigger event is detected. If yes, the flow proceeds to 1035 and a position of a waveform is automatically shifted to conform with a time of the post-acquisition trigger event. Thereafter, the flow proceeds to 1040 where a determination is made whether the live-acquisition of data has been re-started, and based on the determination, either path 'A' or 'B' can be taken. If no, the flow proceeds through 'A' and returns to wait for input from the user. At this point, if the user adjusts the standard trigger controls to search at 1020 for events in the data record, the flow proceeds to 1040, where a similar determination is made whether the live-acquisition of data has re-started.

Embodiments of the invention include a method for acquiring data from a signal under test for storage in an acquisition memory as a data record and displaying a waveform associated with the signal under test while acquiring the data. After acquiring the data record, the user may adjust standard trigger controls to select trigger criteria. A trigger circuit can detect a post-acquisition trigger event in the data record based on the trigger criteria and automatically shift a position of the waveform to conform with a time of the post-acquisition trigger event. A trigger level control can be adjusted to select a first trigger point while acquiring the data, and can be adjusted to select a second trigger point after acquiring the data. Adjusting the trigger level control after acquiring the data can include selecting the second trigger point for the post-acquisition trigger event. When the live acquisition of data resumes, the previously selected post-acquisition trigger criteria can be automatically applied to the live trigger criteria.

Although particular embodiments have been described, it will be appreciated that the principles of the invention are not limited to those embodiments. For example, in addition to the post-acquisition trigger features described above, the standard trigger controls can also be used to cause the trigger circuit to search for other types of events, such as defects in the waveform, as stored in the data record, during a post-acquisition mode. This allows users to implement searches of the data record using controls with which they are most familiar. Variations and modifications may be made without departing from the principles of the invention as set forth in the following claims.

The invention claimed is:

1. A test and measurement instrument, comprising:
an input terminal to receive a signal under test;
one or more analog-to-digital converters associated with the input terminal, the one or more analog-to-digital converters to receive the signal under test and to produce digital samples from the signal under test;
an acquisition memory to store the digital samples of the signal under test as a data record;
a display device associated with the signal under test;
a first trigger circuit having an input coupled to the input terminal, the first trigger circuit to detect a live trigger event in the signal under test based on first trigger criteria and to cause an automatic adjustment of a waveform to conform with a time of the live trigger event;
a second trigger circuit to detect one or more post-acquisition trigger events in the data record based on second trigger criteria, wherein the display device is configured to adjust a display of the one or more post-acquisition trigger events and a waveform associated with the data record responsive to one or more configurable trigger controls.

2. The test and measurement instrument of claim 1, wherein the one or more trigger controls are configurable to cause two or more post-acquisition trigger events or two or more waveforms to be simultaneously displayed.

3. The test and measurement instrument of claim 1, wherein the one or more trigger controls are configurable to cause all post-acquisition trigger events associated with the data record to be simultaneously displayed.

4. The test and measurement instrument of claim 1, wherein the one or more trigger controls are configurable to cause N number of post-acquisition trigger events associated with the data record to be simultaneously displayed.

5. The test and measurement instrument of claim 1, wherein the one or more trigger controls are configurable to adjust a range of the number of post-acquisition trigger events associated with the data record to be simultaneously displayed.

6. The test and measurement instrument of claim 1, wherein the one or more trigger controls are configurable to cause at least one of (a) a next post-acquisition trigger event associated with the data record to be found and displayed, (b) a previous post-acquisition trigger event associated with the data record to be found and displayed, (c) a first post-acquisition trigger event associated with the data record to be found and displayed, and (d) a last post-acquisition trigger event associated with the data record to be found and displayed.

7. The test and measurement instrument of claim 1, wherein the second trigger circuit further comprises a memory to store three or more post-acquisition trigger events.

8. The test and measurement instrument of claim 1, wherein the second trigger circuit further comprises a memory to store N post-acquisition trigger events, wherein N is less than the total number of post-acquisition trigger events associated with the data record.

9. The test and measurement instrument of claim 1, wherein the second trigger circuit further comprises a memory having a plurality of memory locations, each memory location being associated with a corresponding one column of the display device, wherein each memory location is configured to store information indicating whether a post-acquisition trigger event occurred at a time or place of the corresponding one column.

10. The test and measurement instrument of claim 1, wherein the display device is configured to mark each of the post-acquisition trigger events with a graphical marker toward a top area of the display device, the graphical marker corresponding to a trigger time of the post-acquisition trigger event.

11. The test and measurement instrument of claim 2, wherein each of the two or more post-acquisition trigger events is associated with a corresponding one of the waveforms.

12. The test and measurement instrument of claim 5, wherein the one or more trigger controls are configurable to adjust a range of the number of waveforms associated with the data record to be simultaneously displayed.

13. The test and measurement instrument of claim 7, wherein the memory is configured to store a time or place of each of the three or more post-acquisition trigger events.

14. The test and measurement instrument of claim 12, wherein the one or more trigger controls are configurable to adjust the ranges until a single waveform and a single post-acquisition trigger event is displayed.

15. A test and measurement instrument, comprising:
an input terminal to receive a signal under test;
one or more analog-to-digital converters associated with the input terminal, the one or more analog-to-digital converters to receive the signal under test and to produce digital samples from the signal under test;
an acquisition memory to store the digital samples of the signal under test as a data record;
a display device to draw one or more waveforms associated with the signal under test;
an analog trigger circuit having an input coupled to the input terminal, the analog trigger circuit to detect a live trigger event in the signal under test based on first trigger criteria and to cause an automatic adjustment to the one or more waveforms to conform with a time of the live trigger event; and
one or more digital-to-analog converters to receive the digital samples from the acquisition memory and to produce a converted analog signal,
wherein the analog trigger circuit is configured to receive the converted analog signal to detect a post-acquisition trigger event in the data record based on second trigger criteria and to cause an automatic adjustment to the one or more waveforms to conform with a time of the post-acquisition trigger event.

16. The test and measurement instrument of claim 15, further comprising:
first trigger controls to configure the first trigger criteria for detecting the live trigger event and to configure the second trigger criteria for detecting the post-acquisition trigger event.

17. The test and measurement instrument of claim 16, further comprising:
second trigger controls to configure which of the trigger events or waveforms are displayed on the display device.

* * * * *